(12) United States Patent
Masui et al.

(10) Patent No.: US 12,027,567 B2
(45) Date of Patent: Jul. 2, 2024

(54) PIXELATED LED ARRAY WITH OPTICAL ELEMENTS

(71) Applicant: Lumileds LLC, San Jose, CA (US)

(72) Inventors: Hisashi Masui, San Jose, CA (US); Ken Shimizu, Sunnyvale, CA (US); Emma Dohner, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 278 days.

(21) Appl. No.: 16/894,449

(22) Filed: Jun. 5, 2020

(65) Prior Publication Data

US 2020/0303450 A1 Sep. 24, 2020

Related U.S. Application Data

(63) Continuation of application No. 16/358,085, filed on Mar. 19, 2019, now Pat. No. 10,910,433.

(60) Provisional application No. 62/787,006, filed on Dec. 31, 2018.

(51) Int. Cl.
| | |
|---|---|
| H01L 33/50 | (2010.01) |
| F21K 9/64 | (2016.01) |
| H01L 25/075 | (2006.01) |
| H01L 27/15 | (2006.01) |
| H01L 33/60 | (2010.01) |

(52) U.S. Cl.
CPC ............ *H01L 27/156* (2013.01); *H01L 33/50* (2013.01); *H01L 33/60* (2013.01); *H01L 2933/0033* (2013.01); *H01L 2933/0041* (2013.01); *H01L 2933/0058* (2013.01)

(58) Field of Classification Search
CPC ........... H01L 2933/0041; H01L 33/502; H01L 33/507; H01L 33/58
See application file for complete search history.

(56) References Cited

U.S. PATENT DOCUMENTS

| | | | |
|---|---|---|---|
| 8,269,235 | B2 | 9/2012 | Bierhuizen |
| 9,196,653 | B2 | 11/2015 | Leatherdale et al. |
| 9,624,124 | B2 | 4/2017 | Aitken et al. |
| 10,368,417 | B2 | 7/2019 | Kim et al. |
| 10,910,433 | B2 | 2/2021 | Masui et al. |
| 11,024,781 | B2 | 6/2021 | Basin et al. |
| 11,527,685 | B2 * | 12/2022 | Chang .................. H01L 33/505 |

(Continued)

FOREIGN PATENT DOCUMENTS

| | | |
|---|---|---|
| CN | 102576783 A | 7/2012 |
| CN | 103109370 A | 5/2013 |

(Continued)

OTHER PUBLICATIONS

Notice of Allowance corresponding to U.S. Appl. No. 16/226,607, dated Apr. 28, 2020, 13 pages.

(Continued)

*Primary Examiner* — Anthony Ho
*Assistant Examiner* — David J Goodwin (57) ABSTRACT

The pcLED pixels in a phosphor-converted LED array each comprise an optical element on the light-emitting surface above the phosphor layer. In methods for making such pixelated LED arrays, a thin layer of a sacrificial phosphor carrier substrate is retained as the optical element on the output surface of the phosphor pixels upon completion of the fabrication process.

15 Claims, 5 Drawing Sheets

(56) References Cited

U.S. PATENT DOCUMENTS

| | | |
|---|---|---|
| 2010/0123386 A1* | 5/2010 | Chen .................... H01L 33/507 |
| | | 359/896 |
| 2011/0266569 A1 | 11/2011 | Basin et al. |
| 2012/0052608 A1 | 3/2012 | Yoo et al. |
| 2012/0256187 A1 | 10/2012 | Yu et al. |
| 2012/0286701 A1 | 11/2012 | Yang et al. |
| 2013/0149508 A1 | 6/2013 | Kwak et al. |
| 2013/0258636 A1 | 10/2013 | Rettke |
| 2014/0061620 A1* | 3/2014 | Sisk ..................... H10K 85/657 |
| | | 548/219 |
| 2014/0339582 A1 | 11/2014 | Matsumura et al. |
| 2015/0162315 A1 | 6/2015 | Yu et al. |
| 2015/0162507 A1* | 6/2015 | McRae ................. H01L 33/505 |
| | | 257/89 |
| 2015/0171287 A1 | 6/2015 | Matsumura et al. |
| 2015/0179904 A1* | 6/2015 | Maaskant ............... H01L 33/64 |
| | | 257/98 |
| 2015/0236227 A1* | 8/2015 | Yan ........................ H01L 33/58 |
| | | 257/98 |
| 2015/0311405 A1 | 10/2015 | Oyamada et al. |
| 2016/0308089 A1* | 10/2016 | Kim ....................... H01L 33/54 |
| 2016/0351620 A1 | 12/2016 | Tanaka |
| 2016/0365702 A1* | 12/2016 | Bower ...................... H01S 5/32 |
| 2016/0372642 A1* | 12/2016 | Cho ........................ H01L 33/54 |
| 2017/0133562 A1 | 5/2017 | Ling et al. |
| 2017/0170360 A1 | 6/2017 | Bour et al. |
| 2017/0207249 A1 | 7/2017 | Rhee |
| 2017/0248280 A1 | 8/2017 | Ichikawa |
| 2017/0317251 A1* | 11/2017 | Sweegers ............... H01L 33/58 |
| 2018/0151543 A1 | 5/2018 | Lee |
| 2018/0192495 A1 | 7/2018 | Kim et al. |
| 2019/0157523 A1 | 5/2019 | Hong |
| 2019/0189865 A1 | 6/2019 | Shimizu et al. |
| 2019/0277455 A1* | 9/2019 | Xu .......................... H01L 33/62 |
| 2019/0324350 A1 | 10/2019 | Van Der Sijde et al. |

FOREIGN PATENT DOCUMENTS

| | | |
|---|---|---|
| CN | 105874617 A | 8/2016 |
| EP | 2610058 A1 | 3/2013 |
| EP | 2610058 A1 | 7/2013 |
| EP | 3012878 A1 | 4/2016 |
| GB | 2554226 A | 3/2018 |
| TW | 201021087 A | 6/2010 |
| TW | 201143165 A | 12/2011 |
| TW | 201535789 A | 9/2015 |
| WO | 2013/175338 A1 | 11/2013 |
| WO | 2014/072865 A1 | 5/2014 |
| WO | 2015/004577 A1 | 1/2015 |
| WO | 2015/135839 A1 | 9/2015 |
| WO | 2019/126582 A1 | 6/2019 |

OTHER PUBLICATIONS

European Search Report corresponding to EP18159224, dated Aug. 2, 2018, 4 pages.
Partial European Search Report corresponding to EP18159224, dated Aug. 2, 2018, 4 pages.
International Search Report where the EPO was the ISA for PCT/US2018/066950, dated Feb. 27, 2019, 4 pages.
Written Opinion of the International Searching Authority for PCT/US2018/066950, dated Feb. 27, 2019, 9 pages.
International Search Report where the EPO was the ISA for PCT/IB2019/001395, dated May 28, 2020, 4 pages.
Written Opinion of the International Searching Authority for PCT/IB2019/001395, dated May 28, 2020, 7 pages.

\* cited by examiner

PIXELATED LED ARRAY WITH OPTICAL ELEMENTS

CROSS REFERENCE TO RELATED APPLICATIONS

This application is a continuation of U.S. patent application Ser. No. 16/358,085 filed Mar. 19, 2019, which claims benefit of priority to U.S. Provisional Patent Application No. 62/787,006 filed Dec. 31, 2018, each of which is incorporated herein by reference in its entirety.

FIELD OF THE INVENTION

The invention relates generally to phosphor-converted light emitting diodes.

BACKGROUND

Semiconductor light emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

LEDs may be combined with one or more wavelength converting materials (generally referred to herein as "phosphors") that absorb light emitted by the LED and in response emit light of a longer wavelength. For such phosphor-converted LEDs ("pcLEDs"), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer.

Phosphor-converted LEDs may be designed so that all of the light emitted by the LED is absorbed by one or more phosphors, in which case the emission from the pcLED is entirely from the phosphors. In such cases the phosphor may be selected, for example, to emit light in a narrow spectral region that is not efficiently generated directly by an LED. Alternatively, pcLEDs may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed to emit, for example, white light having a desired color temperature and desired color-rendering properties.

SUMMARY

This specification discloses phosphor-converted LED arrays in which the pcLED pixels each comprise an optical element on the light-emitting surface above the phosphor layer, as well as methods for making such arrays. In the disclosed methods, a thin layer of a sacrificial phosphor carrier substrate is retained as the optical element on the output surface of the phosphor pixels upon completion of the fabrication process.

This remaining thin layer of the phosphor carrier substrate allows for more tolerance in end point detection during removal of the sacrificial carrier substrate without impacting optical properties of the pcLED such as color point, for example. This can result in higher manufacturing yield.

Further, the carrier substrate material and the texture (finish) and geometry of the carrier substrate surface can be used to affect the appearance and output of the pcLED in a desired manner. The carrier substrate material may be, for example, a transparent glass, a transparent crystal, a tinted glass, or a translucent material. The portion of the phosphor carrier substrate retained on the phosphor pixel may be patterned or otherwise configured or selected to function, for example, as a micro or meta-lens, a light extraction element, a dichroic filter, an off-state white diffuser layer, a polarizer, or as any other suitable optical element.

The retained portion of the sacrificial carrier substrate may have a thickness of, for example, about 5 microns to about 50 microns perpendicular to the light-emitting surface on the phosphor layer.

Other embodiments, features and advantages of the present invention will become more apparent to those skilled in the art when taken with reference to the following more detailed description of the invention in conjunction with the accompanying drawings that are first briefly described.

DETAILED DESCRIPTION

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention.

Figure 1:
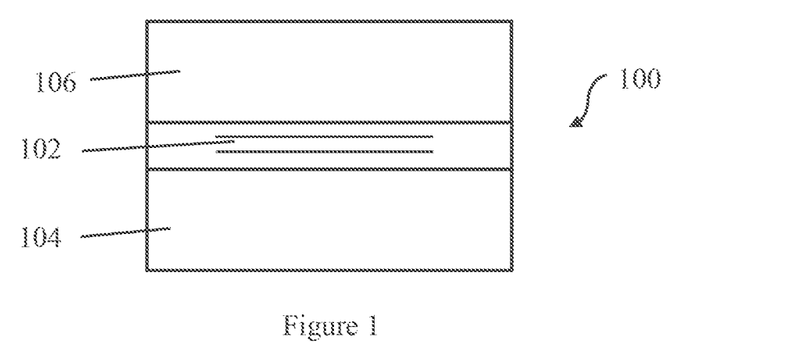
FIG. 1 shows a schematic cross-sectional view of an example pcLED.

FIG. 1 shows an example of an individual pcLED 100 comprising a semiconductor diode structure 102 disposed on a substrate 104, together considered herein an "LED", and a phosphor layer or structure 106 disposed on the LED. Semiconductor diode structure 102 typically comprises an active region disposed between n-type and p-type layers. Application of a suitable forward bias across the diode structure results in emission of light from the active region. The wavelength of the emitted light is determined by the composition and structure of the active region.

The LED may be, for example, a III-Nitride LED that emits blue, violet, or ultraviolet light. LEDs formed from any other suitable material system and that emit any other suitable wavelength of light may also be used. Other suitable material systems may include, for example, III-Phosphide materials, III-Arsenide materials, and II-VI materials.

Any suitable phosphor materials may be used, depending on the desired optical output from the pcLED.

Figure 2A:
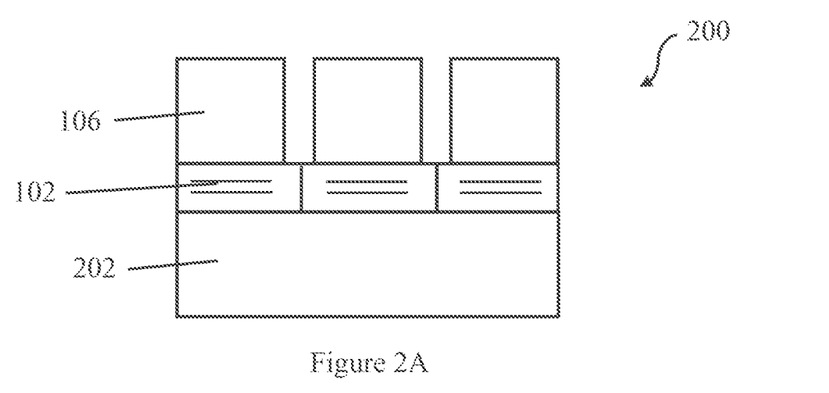
FIGS. 2A and 2B show, respectively, cross-sectional and top schematic views of an array of pcLEDs.
Figure 2B:
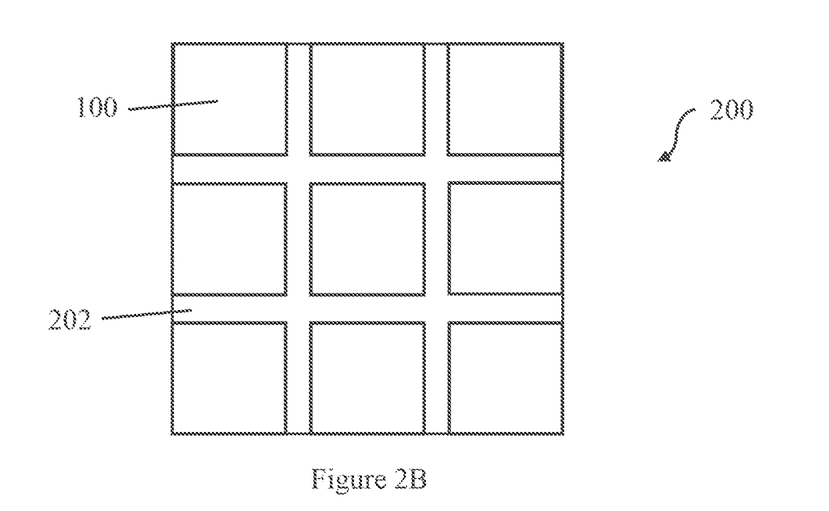

FIGS. 2A-2B show, respectively, cross-sectional and top views of an array 200 of pcLEDs 100 including phosphor pixels 106 disposed on a substrate 202. Such an array may include any suitable number of pcLEDs arranged in any suitable manner. In the illustrated example the array is depicted as formed monolithically on a shared substrate, but alternatively an array of pcLEDs may be formed from separate individual pcLEDs. Substrate 202 may optionally comprise CMOS circuitry for driving the LED, and may be formed from any suitable materials.

Figure 3A:
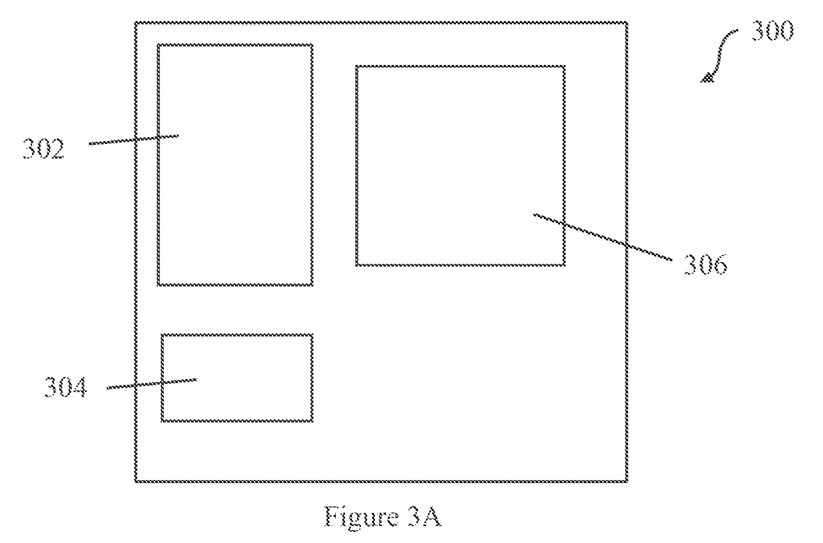
FIG. 3A shows a schematic top view of an electronics board on which an array of pcLEDs may be mounted, and FIG. 3B similarly shows an array of pcLEDs mounted on the electronic board of FIG. 3A.
Figure 3B:
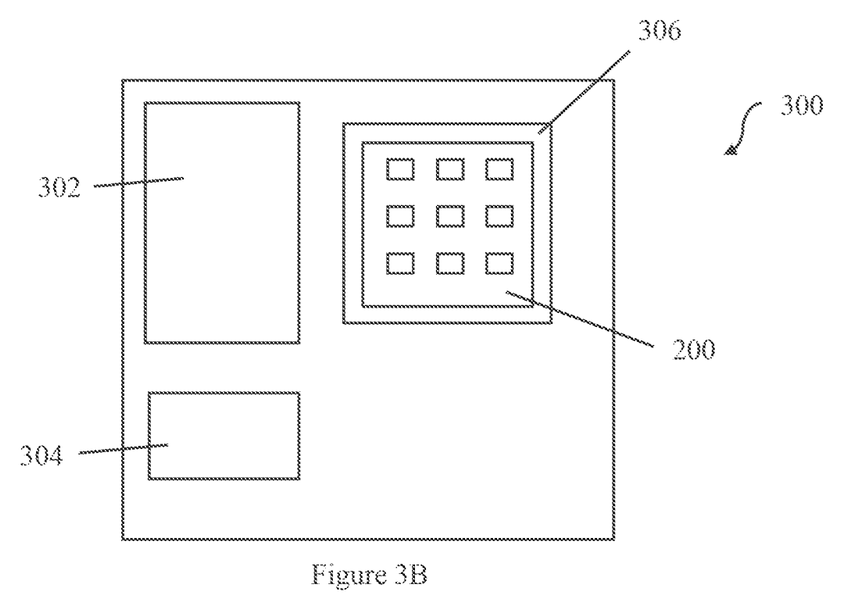

As shown in FIGS. 3A-3B, a pcLED array 200 may be mounted on an electronics board 300 comprising a power and control module 302, a sensor module 304, and an LED attach region 306. Power and control module 302 may receive power and control signals from external sources and signals from sensor module 304, based on which power and control module 302 controls operation of the LEDs. Sensor module 304 may receive signals from any suitable sensors, for example from temperature or light sensors. Alternatively, pcLED array 200 may be mounted on a separate board (not shown) from the power and control module and the sensor module.

Figure 4A:
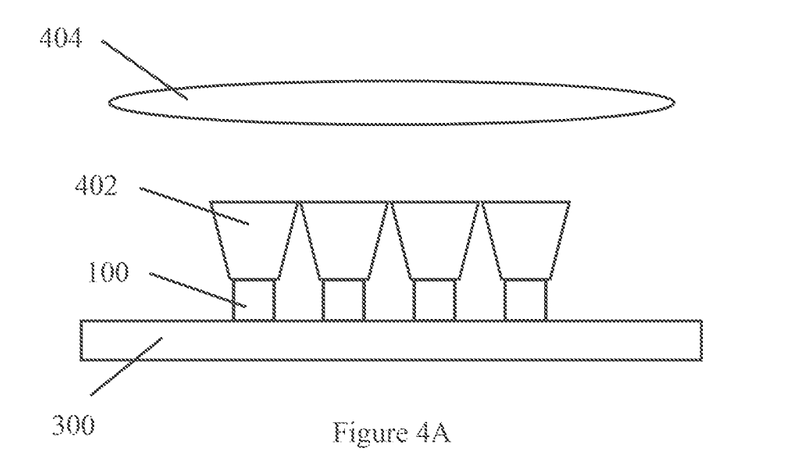
FIG. 4A shows a schematic cross sectional view of an array of pcLEDs arranged with respect to waveguides and a projection lens.
Figure 4B:
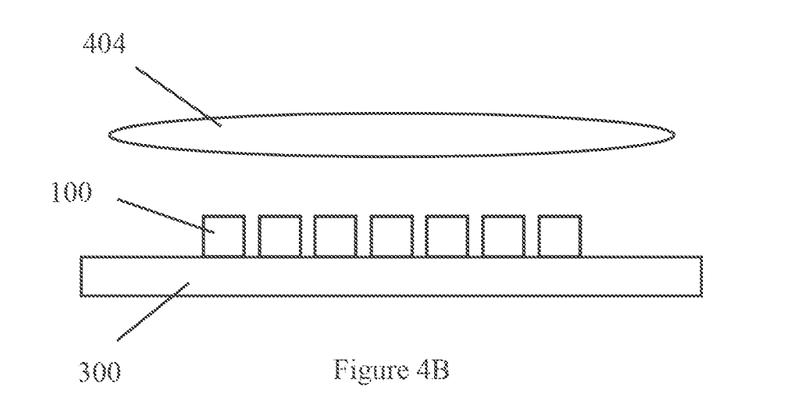
FIG. 4B shows an arrangement similar to that of FIG. 4A, without the waveguides.

Individual pcLEDs may optionally incorporate or be arranged in combination with a lens or other optical element located adjacent to or disposed on the phosphor layer. Such an optical element, examples of which are referred to in greater detail below, may be referred to as a "primary optical element". In addition, as shown in FIGS. 4A-4B a pcLED array 200 (for example, mounted on an electronics board 300) may be arranged in combination with secondary optical elements such as waveguides, lenses, or both for use in an intended application. In FIG. 4A, light emitted by pcLEDs 100 is collected by waveguides 402 and directed to projection lens 404. Projection lens 404 may be a Fresnel lens, for example. This arrangement may be suitable for use, for example, in automobile headlights. In FIG. 4B, light emitted by pcLEDs 100 is collected directly by projection lens 404 without use of intervening waveguides. This arrangement may particularly be suitable when pcLEDs can be spaced sufficiently close to each other, and may also be used in automobile headlights as well as in camera flash applications. A microLED display application may use similar optical arrangements to those depicted in FIGS. 4A-4B, for example. Generally, any suitable arrangement of optical elements may be used in combination with the pcLEDs described herein, depending on the desired application.

As summarized above, this specification discloses pixelated pcLED arrays in which the pcLED pixels each comprise an optical element on the light emitting surface above the phosphor pixel, formed from a retained portion of a sacrificial phosphor carrier substrate used during the manufacturing process. Much or most of the sacrificial phosphor carrier substrate is removed during the manufacturing process.

Figure 5A:
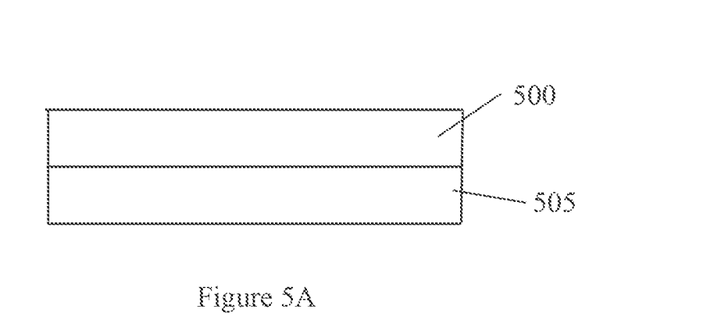
FIG. 5A, FIG. 5B, FIG. 5C, FIG. 5D, FIG. 5E, and FIG. 5F are partial cross-sectional views that schematically show stages in an example method for fabricating a pixelated pcLED array in which the pcLED pixels each comprise an optical element on the light emitting surface above the phosphor pixel, formed from a retained portion of a sacrificial phosphor carrier substrate.

The partial cross-sectional views of FIGS. 5A-5F schematically show stages in an example method for fabricating such a pixelated pcLED array. In FIG. 5A, a phosphor layer 500 is deposited on a phosphor carrier substrate 505. Phosphor layer 500 may comprise phosphor particles dispersed in a binder such as a silicone binder, for example. In such cases the binder may be partially or fully cured at this stage. Any suitable phosphor materials may be used. Suitable phosphor materials may include, for example, YAG, LuAG, silicates, BOSE, β-SiAlON, SCASN, BSSN, KSiF:Mn, SLA, and quantum dots. Phosphor layer 500 may have a thickness of about 20 microns to about 500 microns, for example.

Phosphor carrier substrate 505 may be formed, for example, from a transparent glass, a tinted (colored) glass, a crystalline material, a translucent material, a polarizing material, a polarization rotating material, or a material that functions as a dichroic filter. If the resulting array is to be used as a mobile phone flash, having a translucent layer on top of an otherwise vivid-looking phosphor may desired by the user. Optionally, phosphor carrier 505 may be formed from a material permeable to oxygen, allowing oxygen to diffuse into and through the phosphor pixel in the completed pcLED pixels. Suitable oxygen permeable materials may include, for example, porous materials such as porous glasses, perforated glasses, and glass-fiber reinforced plastics.

Phosphor carrier substrate 505 may have a thickness of about 50 microns to about 200 microns, typically about 100 microns, for example. Any suitable thickness for phosphor carrier 505 may be used.

The surface of phosphor carrier substrate 505 on which the phosphor layer is deposited may be pre-patterned to provide a desired optical effect for the resulting pcLED pixels. For example, the pre-patterning may form a lens (e.g., a Fresnel lens) for each of the resulting pcLED pixels, provide features (e.g., grooves, ridges, protrusions, or other texturing features) that enhance light extraction from the pcLED pixels into air, or scatter light to provide an off-state white diffuser layer for each pcLED pixel.

Figure 5B:
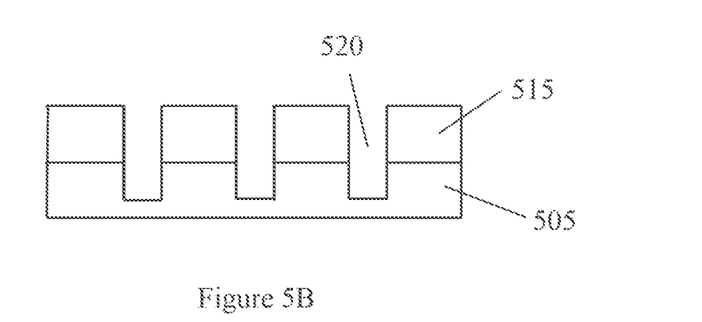

Subsequently, as shown in FIG. 5B, individual phosphor pixels are defined (singulated) by forming trenches 520 through phosphor layer 500 and into, but not entirely through, phosphor carrier substrate 505 to form an array of phosphor pixels 515. This may be done by sawing, for example, but any suitable singulation method may be used. The phosphor pixels may be formed in a rectangular (e.g., square) array, for example, by intersecting trenches formed in phosphor layer 500.

Trenches 520 may have a width of, for example, about 5 microns to about 200 microns. Trenches 520 may penetrate phosphor carrier substrate 505 to a depth of, for example, about one quarter or more of the thickness of the substrate but must be shallower than the thickness of the substrate to keep the pixels unseparated. Trenches 520 may be spaced apart from each other by, for example, about 5 microns to about 200 microns.

Figure 5C:
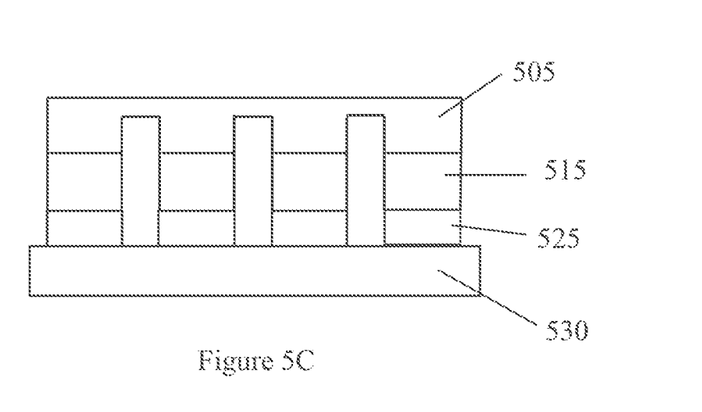

Subsequently, as shown in FIG. 5C, each phosphor pixel 515 in the array of phosphor pixels is attached to a corresponding LED 525 in an array of semiconductor LEDs. LEDs 525 may be supported by a substrate 530, for example, which may be formed from any suitable material. Attachment of the phosphor pixels to the LEDs may be by any suitable method. If the phosphor pixels comprise phosphor particles dispersed in a binder, they may for example be attached to the individual LEDs by curing or further curing the binder to form bonds to the LEDs. Alternatively, or in addition, a separate adhesive layer may be used to attach the phosphor pixels to the LEDs.

Figure 5D:
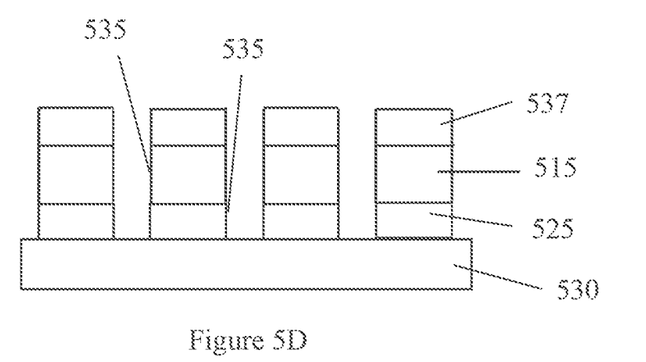

Subsequently, as shown in FIG. 5D, a sufficient thickness of phosphor carrier 505 is removed so that phosphor pixels 515 are no longer interconnected by the phosphor carrier and side walls 535 of the phosphor pixels and of the LEDs are exposed for side coating, described next. Each individual phosphor pixels retains a portion 537 of phosphor carrier 505 on its upper light output surface. For example, a thickness of about 50 microns to about 200 microns of phosphor carrier 505 may be removed at this step. Retained portion 537 of phosphor carrier 505 may have a thickness of, for example, about 5 microns to about 50 microns.

Figure 5E:
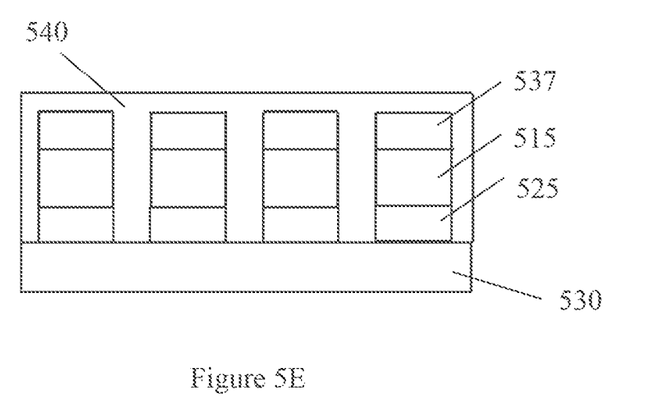

Subsequently, as shown in FIG. 5E, a reflective or scattering material 540 is deposited on the top and sides of the phosphor pixels and the sides of the LEDs. Reflective or scattering material 540 may be or comprise, for example, a light scattering material such as $TiO_2$ particles embedded in silicone, one or more reflective metal layers, or one or more DBR structures formed from a stack of alternating layers of high and low refractive index material. Reflective metal layers may be deposited by vapor deposition or sputtering, for example. DBR structures may be deposited by atomic layer deposition, for example.

Figure 5F:
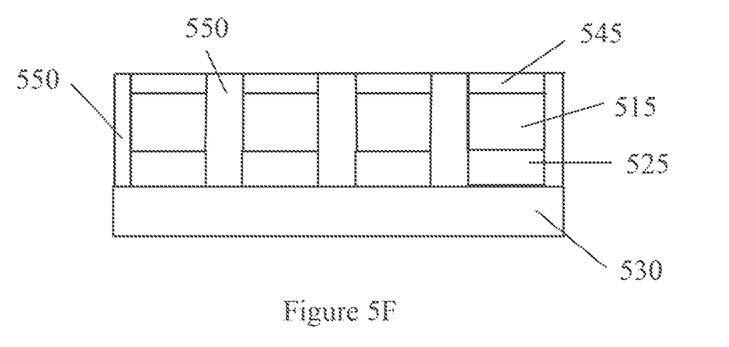

Subsequently, as shown in FIG. 5F, excess reflective or scattering material 540 is removed from the upper light output surfaces of the phosphor pixels by any suitable method, for example by mechanical grinding or polishing. Optionally, a further portion of phosphor carrier 505 (for example, about 1 micron to about 45 microns) is removed along with the excess portion of material or structure 540. As noted above, a portion 545 of phosphor carrier 505 is retained on the upper light output surface of each phosphor pixel. Retained portion 545 may have a thickness of, for example, about 5 microns to about 10 microns, or any other suitable thickness.

Remaining portions of reflective or scattering material 540 form side walls 550 on the phosphor pixels and LEDs, optically isolating individual pcLED pixels from each other.

Depending on the intended application for the pcLEDs and their dimensions, the resulting pixelated array shown in FIG. 5F may be maintained essentially intact, transferred as an array to another substrate, or divided into separate pcLEDs.

Retaining phosphor carrier portions 545 on the top output surface of the phosphor pixels relaxes manufacturing tolerances compared to a process in which all of sacrificial phosphor carrier 505 is removed to expose the top of the phosphor pixels. This is because variations in the thickness of retained phosphor carrier portions 545 typically have little effect on the performance of the pcLED pixels. In contrast, variations in the thickness of the phosphor pixels may significantly affect the output of the pcLED pixels, because as explained above the amount of light emitted by the LEDs that is absorbed and converted to longer wavelength light by the phosphor pixels depends on the path length of the LED light through the phosphor pixels and thus on the height of the phosphor pixels. Consequently, if all of the sacrificial phosphor carrier 105 is removed, the end point of the removal process must be controlled with sufficient precision so as not to affect the phosphor pixels. That may be challenging.

Further, in a process in which all of sacrificial phosphor carrier 505 is removed, the finish surface of the phosphor pixels cannot be easily controlled to achieve a desired effect such as, for example, affecting light extraction or output radiation pattern.

As explained above, retaining phosphor carrier portion 545 on the top output surface of the phosphor pixel allows incorporating a primary optic into the pcLED pixel during the manufacturing process for the pcLED. This may be advantageous compared to a process in which such a primary optic is separately prepared and subsequently attached to a pcLED pixel. For example, subsequently attaching a primary optic to a pcLED pixel may require additional process steps, may require use of an adhesive or glue that can spill onto other portions of the pcLED pixel, and would require aligning the primary optic with the pcLED pixel. Using retained phosphor carrier portion 545 as a primary optic avoids these difficulties.

Depending on the viscosity of the phosphor material, the retained phosphor carrier portion 545 (the optical element) may retain air structures between the optical element and the film and thereby enhance refractive index contrast and maximize optical performance.

This disclosure is illustrative and not limiting. Further modifications will be apparent to one skilled in the art in light of this disclosure and are intended to fall within the scope of the appended claims.

What is claimed is:

1. A light emitting device comprising:
a plurality of semiconductor light emitting diode structures arranged in an array, each semiconductor light emitting diode structure comprising a first surface, an oppositely positioned second surface, and side surfaces perpendicular to and connecting the first and second surfaces;
a plurality of phosphor pixels each comprising a first surface, an oppositely positioned second surface, and side surfaces perpendicular to and connecting the first and second surfaces, the side surfaces being planar, each phosphor pixel having its second surface attached to the first surface of a corresponding semiconductor light emitting diode structure, each phosphor pixel having a thickness of about 20 microns to about 500 microns perpendicular to the first surface of the semiconductor light emitting diode structure and a longest dimension parallel to a plane of the array of about 5 microns to about 200 microns, adjacent phosphor pixels spaced apart from each other by a distance of about 5 microns to about 200 microns measured parallel to the plane of the array;
a plurality of optical elements each comprising a first surface that is textured and extending in a first direction, an oppositely positioned second surface that is planar, and side surfaces perpendicular to and connecting the first surface and second surface and extending in a second direction perpendicular to the first direction, the side surfaces being planar, each optical element having its second surface attached to the first surface of a corresponding phosphor pixel, its side surfaces aligned with corresponding ones of the side surfaces of the phosphor pixel and corresponding ones of the side surfaces of the semiconductor light emitting diode structure to collectively form a planar surface, and a thickness of about 5 microns to about 50 microns perpendicular to the first surface of the phosphor pixel, and
a reflective or scattering material disposed between and directly contacting adjacent ones of the semiconductor light emitting diode structures, adjacent ones of the phosphor pixels, and adjacent ones of the optical elements.

2. The light emitting device of claim 1, wherein the second surface of each optical element is patterned to form a lens.

3. The light emitting device of claim 1, wherein the second surface of each optical element is patterned to form a Fresnel lens.

4. The light emitting device of claim 1, wherein the second surface of each optical element is patterned to enhance light extraction from the phosphor pixel.

5. The light emitting device of claim 1, wherein the second surface of each optical element is patterned to scatter light so it appears white under white light illumination when the corresponding semiconductor light emitting diode structure is not operating.

6. The light emitting device of claim 1, wherein each optical element is formed from a transparent or colored glass.

7. The light emitting device of claim 1, further comprising $TiO_2$ particles embedded in silicone disposed between adjacent phosphor pixels.

8. The light emitting device of claim 1, wherein each optical element is formed from a material that is translucent under white light illumination.

9. The light emitting device of claim 1, wherein each optical element is formed from a crystalline material.

10. The light emitting device of claim 1, wherein each optical element is a dichroic filter.

11. The light emitting device of claim 1, wherein each optical element is permeable to oxygen.

12. The light emitting device of claim 1, wherein each optical element polarizes light or rotates the polarization of light.

13. The light emitting device of claim 1, comprising one or more air pockets between each optical element and the phosphor pixel to which it is attached.

14. The light emitting device of claim 1, wherein each optical element is formed from a transparent glass.

15. The light emitting device of claim 1, wherein each optical element is formed from a colored glass.

* * * * *